United States Patent [19]

Yui et al.

[11] Patent Number: 5,053,614
[45] Date of Patent: Oct. 1, 1991

[54] EXPOSURE CONTROL METHOD AND APPARATUS COMPENSATING FOR DETECTION OF OFFSET FROM A MEASURED VALUE

[75] Inventors: Yoshikiyo Yui; Yuji Tsuruoka, both of Kawasaki, Japan

[73] Assignee: Canon Kabushiki Kaisha, Tokyo, Japan

[21] Appl. No.: 596,401

[22] Filed: Oct. 2, 1990

Related U.S. Application Data

[63] Continuation of Ser. No. 456,451, Dec. 26, 1989, abandoned.

[30] Foreign Application Priority Data

Dec. 28, 1988 [JP] Japan ................................ 63-328833

[51] Int. Cl.$^5$ .............................................. G01J 1/32
[52] U.S. Cl. ..................................... 250/205; 355/68
[58] Field of Search ................... 250/205, 548; 354/4, 354/5; 355/68, 69; 219/121.61, 121.62

[56] References Cited

U.S. PATENT DOCUMENTS 4,512,657 4/1985 Sakato .................................. 355/68
4,711,568 12/1987 Torigoe et al. ...................... 355/68
4,773,750 9/1988 Bruning .............................. 353/122

Primary Examiner—David C. Nelms
Assistant Examiner—Khaled Shami
Attorney, Agent, or Firm—Fitzpatrick, Cella, Harper & Scinto

[57] ABSTRACT

An exposure apparatus includes a pulsed light source for repeatedly emitting a pulsed light; a photoelectric converting device for receiving at least a portion of the pulsed light from the pulsed light source; and a control device for controlling the emission of the pulsed light source, on the basis of a value related to a difference between a photoelectric signal produced from the photoelectric converting device at the time of emission of the pulsed light and an offset signal produced from the photoelectric converting device at the time of non-emission of the pulsed light.

17 Claims, 9 Drawing Sheets

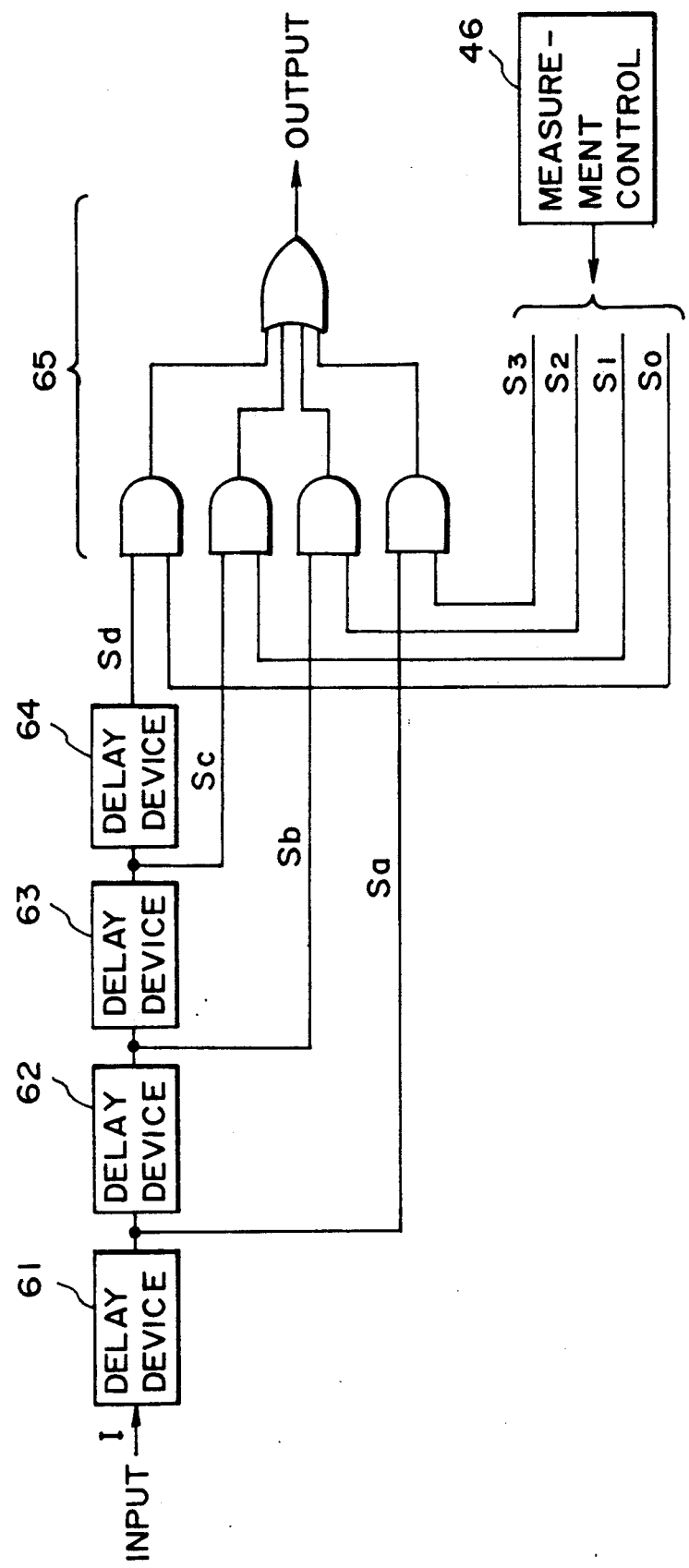
F I G. 6

EXPOSURE CONTROL METHOD AND APPARATUS COMPENSATING FOR DETECTION OF OFFSET FROM A MEASURED VALUE

This application is a continuation of prior application Ser. No. 07/456,451, filed Dec. 26, 1989, now abandoned.

FIELD OF THE INVENTION AND RELATED ART

This invention relates to an exposure apparatus having a printing radiation energy source for producing a pulsed laser beam. More particularly, the invention is concerned with an exposure apparatus having an excimer laser as a radiation energy source, for printing a pattern of a mask on a semiconductor wafer.

In recent photolithography, further miniaturization of semiconductor devices has led to development of exposure apparatuses that use a shorter wavelength to expose a semiconductor wafer. By way of example, a KrF excimer laser can emit a pulsed light of a wavelength of 248 nm and, for an exposure apparatus that uses such an excimer laser as a light source, pattern printing resolution on an order of 0.3 micron is expected. In these types of exposure apparatuses, usually a portion of the pulsed light is converted into an electric signal by using, for example, a photoelectric converting element or a thermoelectric converting element and, by using the obtained signal, the amount of exposure is controlled.

SUMMARY OF THE INVENTION

In such a photoelectric converting element or thermoelectric converting element, a dark current or an offset voltage is present for various reasons. Also, the dark current or the offset voltage involves what can be called a "drift", varying with the lapse of time due to the effect of temperature or otherwise. As a result, when an electric signal obtained by conversion according to the pulsed light is integrated to control the exposure, the offset voltage is integrated together with a signal voltage and, since the drift of the offset voltage cannot be sensed, the integrated value per one pulse of emitted light contains an error (variation).

For example, if the integration period corresponding to one pulse of light is set to be a time period of several tens of nanoseconds in consideration of possible variation of the time from the production of a trigger signal to the actual light emission, since the duration of one light pulse is usually of an order of ten to several tens of nanoseconds, the ratio of these time periods is several hundreds versus 1 (one). This means that, if in the integration period there is an offset voltage of 1/hundreds of the signal voltage, a measured value obtained by the integration is approximately twice as much as a true value. Practically, exposure precision of %-2% is required and, in consideration of this, the presence of an offset of 1/thousands of the signal voltage is a problem. If, therefore, no attention is paid to the presence of the offset voltage, it is difficult to preclude deterioration of exposure precision in the integration exposure and thus, it is difficult to achieve correct exposure control.

It is, accordingly, an object of the present invention to provide an exposure apparatus using pulsed light for exposure, by which the integrated exposure amount can be measured at higher precision to allow correct and more precise exposure.

In accordance with an aspect of the present invention, to achieve the above object, there is provided an exposure apparatus having a light source for producing a pulsed light and a measuring means for measuring the energy of the light pulse from the light source, wherein the measuring means includes an offset removing means for removing an offset component contained in the measured value.

The energy of the emitted pulse can be measured by photoelectric conversion and by integration of the pulse portion. Since, however, the element used for the photoelectric conversion has a dark current or an offset voltage variable with time, the measured value contains an offset component corresponding to it. In the present invention, the value in which such offset component is removed and corrected, that is, the integrated value itself of the energy per one pulse of emitted light, is adopted as a true measured value. As a result, correct exposure based on accurate integrated exposure amount can be affected.

The offset removing means includes a means for measuring the offset and a means for memorizing the measured value and subtracting the offset component from the integrated value of the pulse portion. The offset measurement can be done per each light pulse emission or, alternatively, at a specified moment in time such as at an instant immediately before or after the light emitting operation. The moment of measurement may be determined while taking into account the variation of the offset component with time.

The measurement of the offset may be made by the integration to such region that does not contain the pulse portion. A gate pulse which determines the range of integration may be formed by variably delaying a signal which is in a timed relationship with the emitted light pulse, by inverting the phase of the signal or, alternatively, by separately outputting the signals for the light emission and for the offset measurement.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6 is a block diagram showing details of a delay circuit of the FIG. 4 embodiment.

DESCRIPTION OF THE PREFERRED EMBODIMENTS

Figure 1:
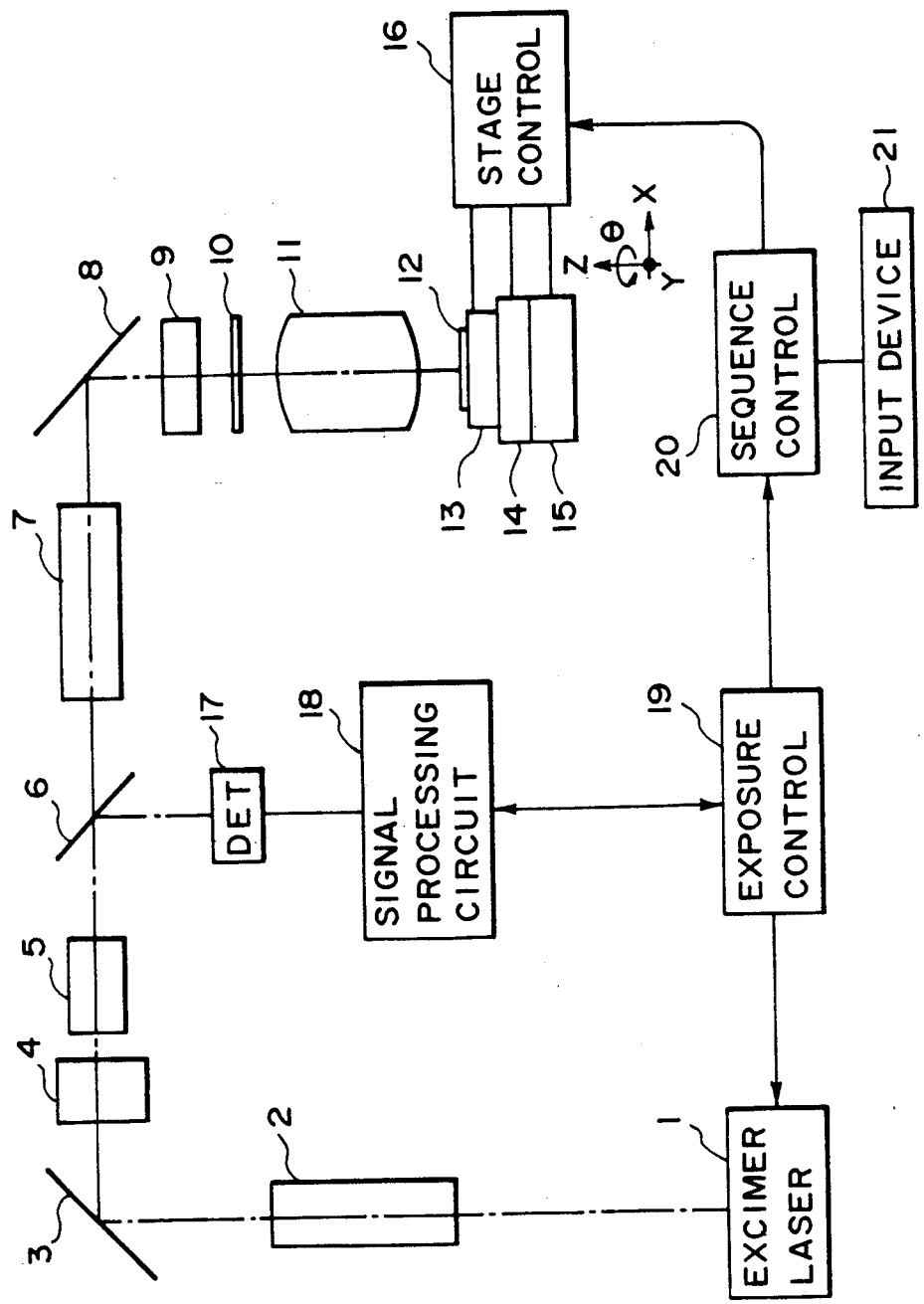
FIG. 1 is a schematic and diagrammatic view showing the general structure of an exposure apparatus according to an embodiment of the present invention.

FIG. 1 shows the general structure of an exposure apparatus which uses a short-wavelength excimer laser as a light source. Denoted in FIG. 1 at 1 is an excimer laser which is an exposure light source; at 2 is a beam shaping optical system for shaping the laser beam from the excimer laser 1; at 3 is a total reflection mirror; at 4 is an incoherent optical system for removing or reducing the coherency of the laser beam; at 5 is a first condenser lens; at 6 is a half mirror for directing a portion of the laser beam to a detector 17 for integration of the exposure amount; at 7 is a second condenser lens; at 8 is a total reflection mirror; at 9 is a collimator lens; at 10 is a reticle which is an original of a circuit device pattern; at 11 is a projection lens system; and at 12 is a wafer on which the pattern of the reticle 10 is to be printed. These elements are disposed along the path of the laser beam from the excimer laser 1, in the named order. Denoted at 13 is a $\theta$-Z stage; at 14 is an X-stage; and at 15 is a Y stage. These stages serve to move the wafer 12 in the X, Y and $\theta$ directions. Denoted at 16 is a stage control unit for controlling these three stages 13, 14 and 15. Denoted at 20 is a sequence control unit for controlling the sequence of the apparatus as a whole. Denoted at 21 is an input device for inputting various parameters into the apparatus. The detector 17 is electrically connected to a signal processing portion 18 whose output is electrically connected to an exposure control unit 19. The exposure control unit 19 serves to control the start and stop of pulse emission of the excimer laser 1.

In this type of apparatus, for obtaining correct exposure, usually the exposure integration technique is used. This technique is such that the exposure energy applied to a wafer 12 is integrated and the exposure is terminated so that the integrated value of the exposure energy becomes equal to a value necessary for obtaining the correct exposure. In FIG. 1, mainly the detector 17, the signal processing unit 18 and the exposure control unit 19 serve to provide such function.

Figure 2:
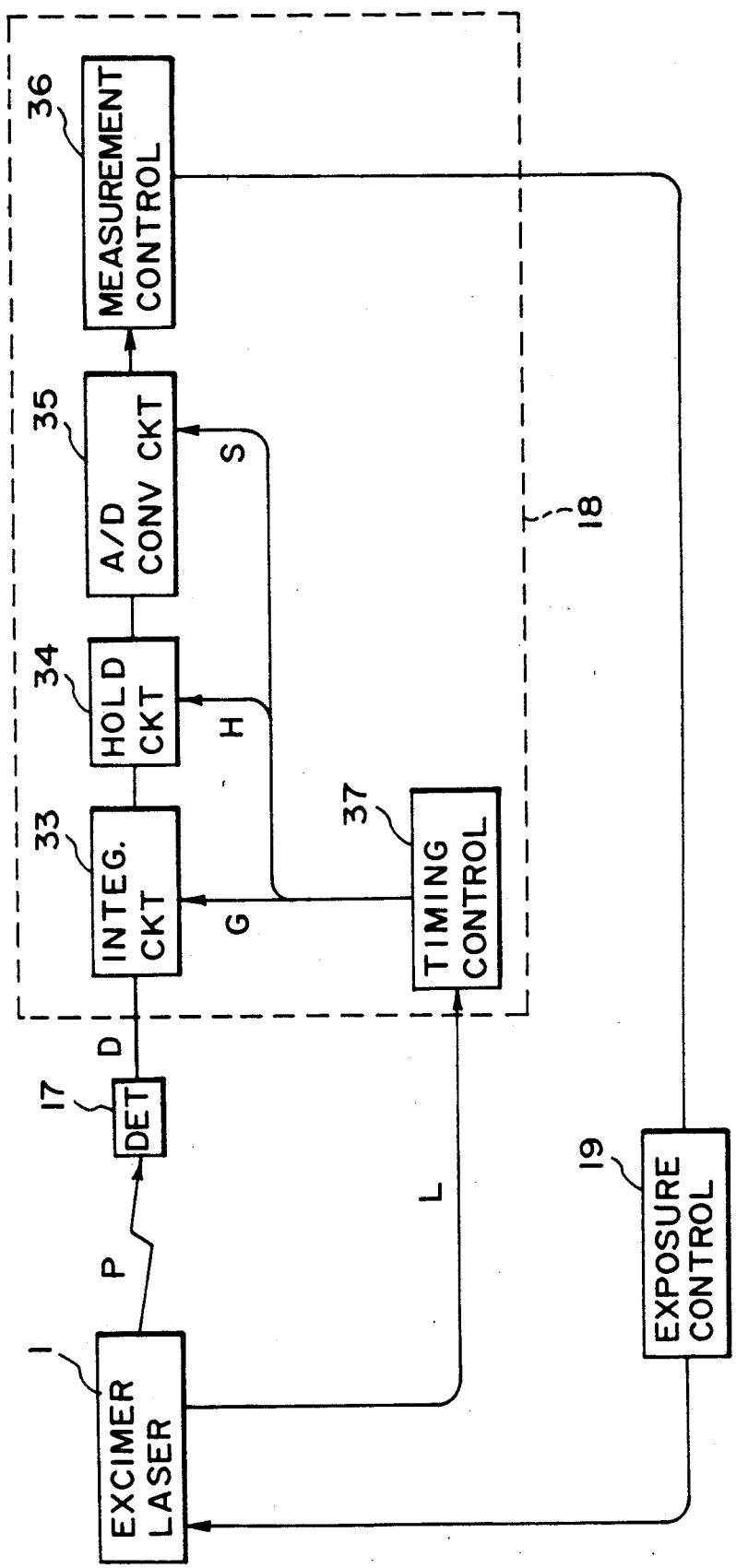
FIG. 2 is a block diagram showing an example of an exposure control system.

FIG. 2 shows details of the signal processing unit 18 which participates in such exposure integration. In FIG. 2, denoted at 1 is an excimer laser, and the light reflected by the half mirror 6 (FIG. 1) is inputted to the detector 17. Denoted at 33 is an integration circuit for integrating the output of the detector 17. Denoted at 34 is a holding circuit for holding the output of the integration circuit 33; at 35 is an analog-to-digital converting circuit (hereinafter "A/D converting circuit") for affecting analog-to-digital conversion of the output of the holding circuit 34; at 36 is a measurement control for integrating the output of the A/D converting circuit 35; and at 37 is a timing control which is responsive to an emission synchronization signal from the excimer laser 1 to supply desired timing signals to the circuits 33, 34 and 35.

Figure 3:
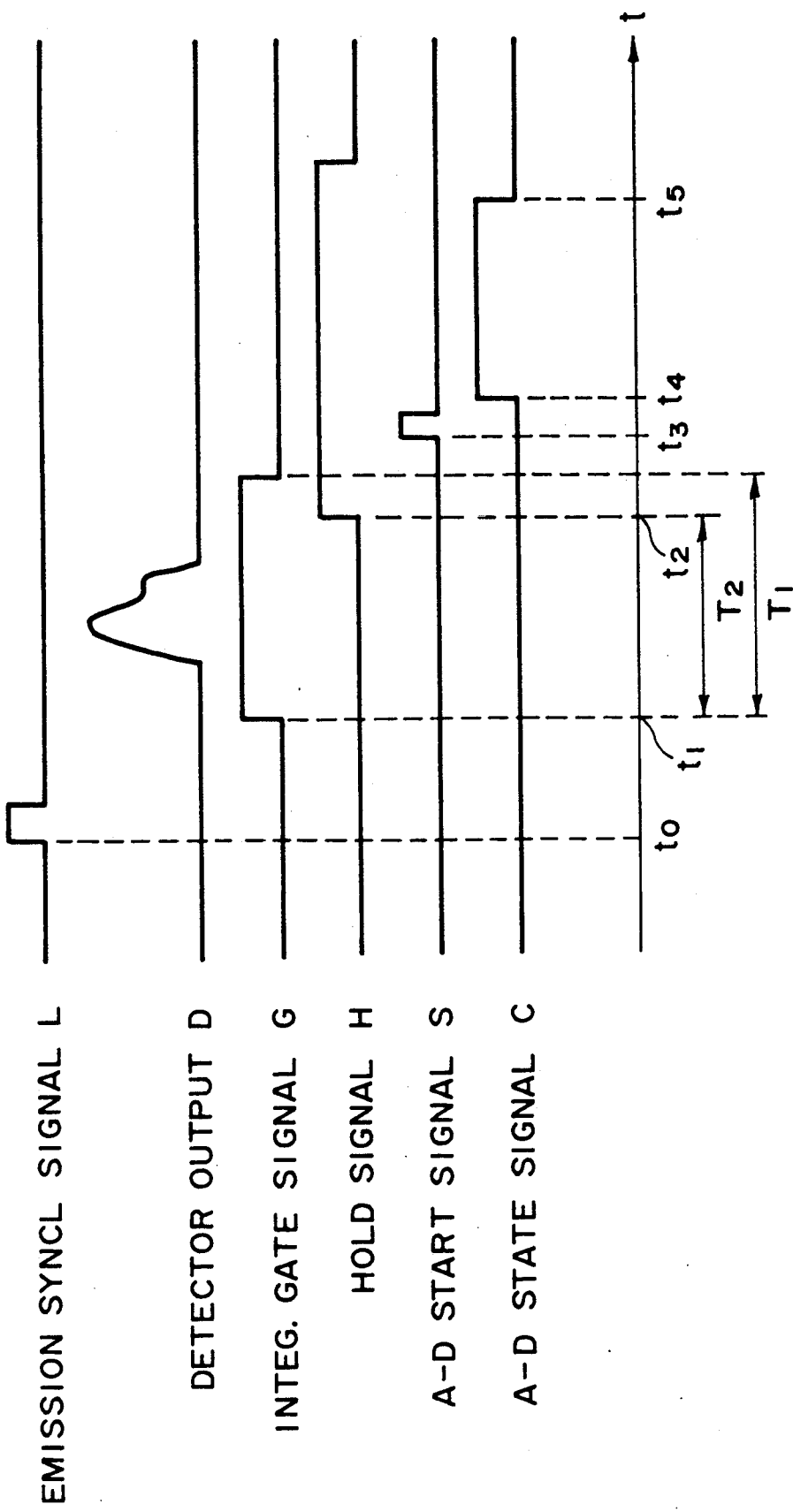
FIG. 3 is a timing chart for explaining the operation of the FIG. 2 system.

FIG. 3 is a timing chart related to the integrating operation to be made in connection with one exposure pulse. The operation will be explained with reference to this Figure as well as to FIG. 2. When the measurement control 46 supplies a light emission instruction to the exposure control 19, the excimer laser 1 produces an emission synchronization signal L and a light pulse P following it. The emission synchronization signal L is inputted to the timing control 37, while the light pulse P is inputted to the detector 17. At time $t_0$, the emission synchronization signal L is inputted to the timing control 37, in response to which the timing control 37 produces an integration gate signal G having a time period $T_1$ from time $t_1$ which is supplied to the integration circuit 33. Accordingly, the output D of the detector 17 which is a light reception signal related to the light pulse P, is integrated in the period of time interval $T_1$. At time $t_2$, the timing control 37 produces a holding signal H which is supplied to the holding circuit 34. At this moment, the hold output of the holding circuit 34, i.e., the value held by the holding circuit 34, corresponds to the output of the integration circuit 33 at time $t_2$. Therefore, the input to the next A/D converting circuit 35 is the integrated value of the detector output D during a time period from time $t_1$ to time $t_2$, namely, the period $T_2$. At time $t_3$, the timing control 37 produces an A/D conversion start signal S which is supplied to the A/D converting circuit 35. In response, the A/D converting circuit 35 starts the converting operation so that the A/D conversion state signal C is rendered into a high level At time $t_5$, the converting operation is completed and the A/D state signal C is returned to a low level. At the same time, the converted data is transmitted to the measurement control 36.

In the manner described above, the energy per one emitted light pulse is measured by integration and, by executing the integration through the measurement control 36 for each of the emitted pulses, the integrated exposure is accomplished. In this method, however, any offset voltage contained in the detector output D is integrated at the same time. Therefore, it is possible that the value obtained through the integration at the measurement control 36 becomes greater than a predetermined value and that, if the exposure control 19 stops the light emission of the excimer laser 1, correct exposure ends in failure.

Figure 4:
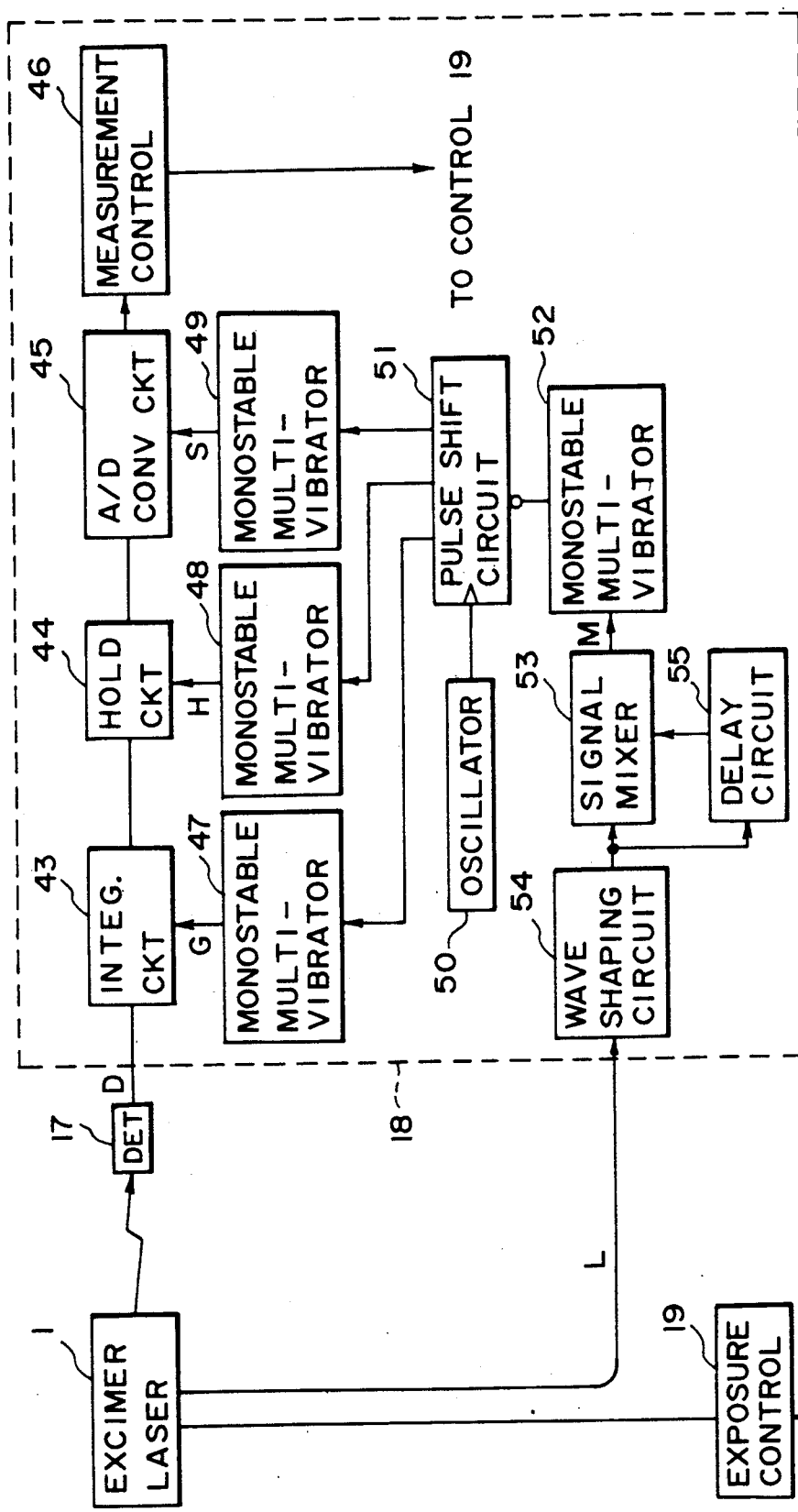
FIG. 4 is a block diagram showing an embodiment of an exposure control system according to the present invention.

FIG. 4 is a block diagram of a major part of an exposure apparatus according to an embodiment of the present invention and shows details of the signal processing unit 18 of FIG. 1. Denoted in FIG. 4 at 1 is an excimer laser which is a light source; at 17 is a detector for receiving each light pulse emitted by the excimer laser 1 and for photoelectrically converting the received pulse; at 43 is an integration circuit for integrating the output of the detector 17; at 44 is a holding circuit for holding the integrated output of the integration circuit 43; at 45 is an A/D converting circuit for executing analog-to-digital conversion to the hold output of the holding circuit 44; at 46 is a measurement control for memorizing the converted output of the A/D converting circuit 45 and for executing the subtraction and integration discriminating processing for the offset removal; at 54 is a wave shaping circuit for receiving an emission synchronization signal L outputted from the excimer laser 1, to execute the wave shaping; at 55 is a delay circuit for delaying the output of the wave shaping circuit 54 for a predetermined time; at 53 is a signal mixer for obtaining a logical sum of the delay output of the delay circuit 55 and the output of the wave shaping circuit 54; at 52 is a monostable multivibrator operable at the rise of the output signal of the signal mixer 53; at 51 is a pulse shift circuit for executing the pulse shifting at the oscillation period of an oscillator 50 when the monostable multivibrator 52 is at a non-stable level; and at 47, 48 and 49 are monostable multivibrators each being operable at the rise of a corresponding shift pulse output of the pulse shift circuit 51.

Figure 5:
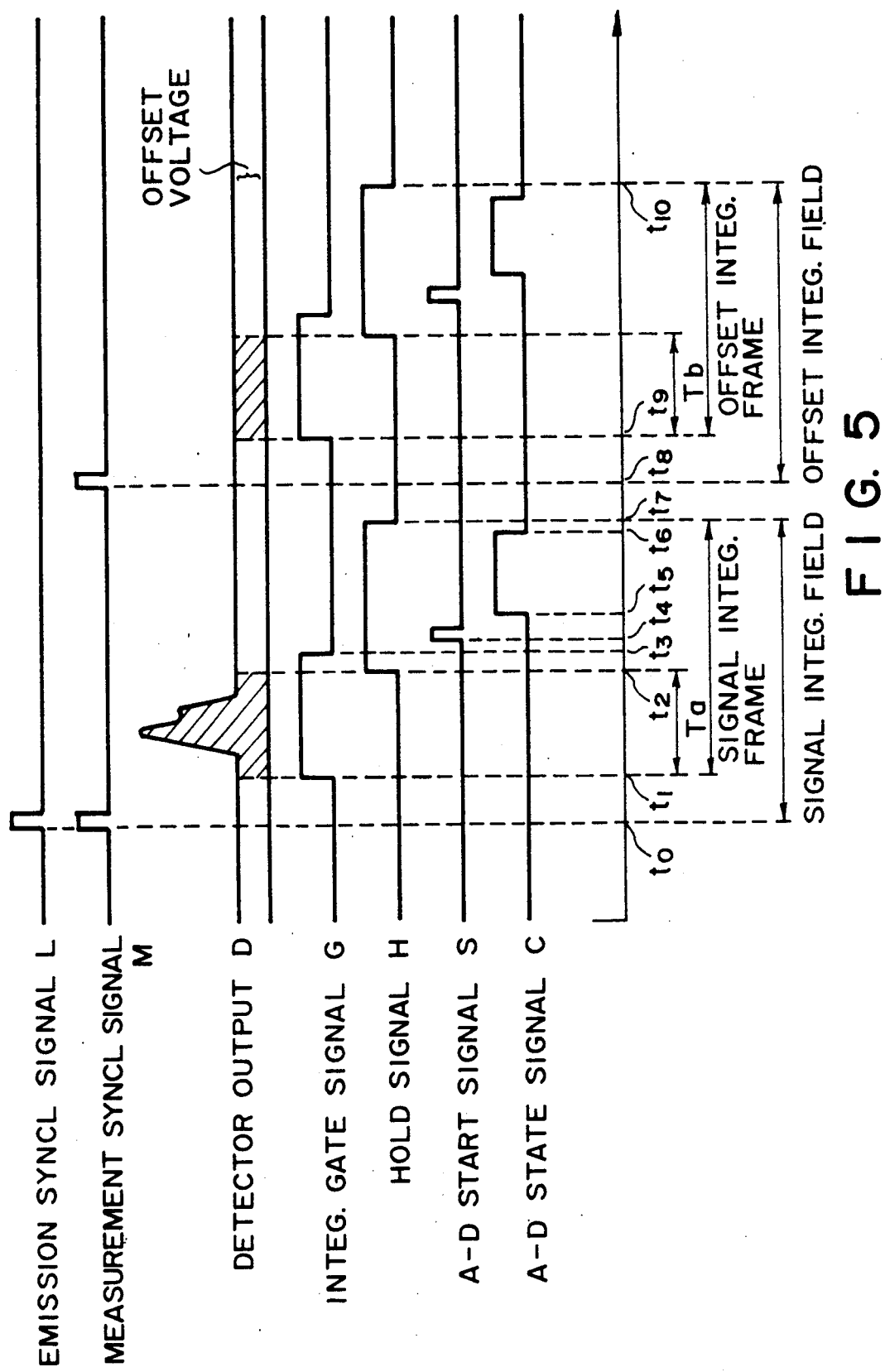
FIG. 5 is a timing chart, for explaining the operation of the exposure control system of FIG. 4.

FIG. 5 is a timing chart which relates to the FIG. 4 embodiment and shows the integrating operation to one emitted light pulse from the excimer laser 1. Referring to this Figure, the operation of each portion of the FIG. 4 structure will be explained. However, in this example, it is assumed that once the exposure control 19 outputs a light emission instruction to the excimer laser 1, the pulsed light emission of the excimer laser 1 is repeatedly affected until the exposure control 19 supplies an emission stop instruction to the excimer laser 1.

The excimer laser 1 is arranged so that, in response to reception of the light emission instruction, it produces an emission synchronization signal L and that, after an elapse of a certain time thereafter, it emits light. If the emission synchronization signal L is outputted at time $t_0$, the emission synchronization signal L is shaped by the wave shaping circuit 54 and, thereafter, is inputted to the signal mixer 53 and the delay circuit 55. The input to the delay circuit 55 is outputted to the signal mixer 53 with a delay which is longer than the signal integration field (see FIG. 5). At the signal mixer 53, a logical sum of these two input signals is calculated and the result of the calculation is outputted in the form of a measurement synchronization signal M. The measurement synchronization signal M is inputted to the monostable multivibrator 52, and the output thereof functions as an enable signal for the pulse shift circuit 51 and a signal integration frame and an offset integration frame (see FIG. 5) are produced. The pulse shift circuit 51 changes the output terminal of the pulse at each period of the oscillation frequency of the oscillator 50 and determines the trigger timing for each monostable multivibrator 47, 48 or 49. In accordance with the output of the pulse shift circuit 51, the monostable multivibrator 47 produces an integration gate signal G which specifies the integration period, and the integration circuit 43 integrates the detector output signal D in the period from time $t_1$ to time $t_3$. On the other hand, the monostable multivibrator 48 produces a hold signal H which specifies the timing for holding the output of the integration circuit 43. In response to this hold signal, the holding circuit 44 holds the output of the integration circuit 43 at time $t_2$. The input to the subsequent A/D converting circuit 45 corresponds to the hold output of the holding circuit 44 and is the integrated value defined at time $t_2$. Therefore, the actual integration period is the period from time $t_1$ to time $t_2$, namely, the period $T_a$. Subsequently, the monostable multivibrator 49 produces an A/D conversion start signal S which specifies the timing of the start of analog-to-digital conversion. In response, the A/D converting circuit 45 starts the converting operation at time $t_5$ and, additionally, it renders the A/D conversion state signal C into a high level. The converting operation is completed at time $t_6$, and A/D converting circuit 45 renders the A/D state signal C back to a low level. Simultaneously therewith, the converting circuit transmits the converted data to the measurement control 46. The measurement control 46 temporarily stores the received converted data. Further, at time $t_7$, the holding instruction by the hold signal H from the monostable multivibrator 48 is released and a series of operations are finished. If at time $t_8$ the next pulse in the measurement synchronization signal M is inputted to the pulse shift circuit 51, the above-described sequential operation is executed again. However, in that case, the output of the detector 17 does not contain a signal component due to the emitted light pulse of the excimer laser 1. In the manner described above, both in the signal integration field including the signal integration frame from time $t_1$ to time $t_7$ and in the offset integration field including the offset integration frame from time $t_9$ to time $t_{10}$, respective measured values are obtained and are memorized in the measurement control 46.

The measured value obtained with the signal integration field corresponds to the integrated value of the signal component and the offset voltage of the emitted light pulse in the period $T_a$ shown in FIG. 5, whereas the measured value obtained with the offset integration field corresponds to the integrated value of the offset voltage, only, in the period $T_b$. Since the time interval of the period $T_a$ is equal to that of the period $T_b$, it is clear that the difference between these integrated values corresponds to the integrated value of only the signal component of the light pulse. Therefore, at the measurement control 46, subtraction is made to the two data and, for each light pulse, the difference obtained thereby is integrated to obtain an integrated exposure amount. When the thus obtained integrated exposure amount becomes equal to or greater than a predetermined amount, the exposure control 19 stops the light emission of the excimer laser 1. By this, it is possible to execute the exposure with a correct exposure amount.

FIG. 6 is a block diagram showing an example of delay circuit 55. In this example, the interval between the signal integration field and the offset integration field shown in FIG. 5 can be made variable. Denoted in FIG. 6 at 61, 62, 63 and 64 are delay devices to which an input signal I is outputted sequentially with a regular delay time which is predetermined. On the other hand, a multiplexer 65 is responsive to the exclusive selection of delay designating signals $S_0$–$S_3$ by the measurement control 46 to select a desired one of delay outputs $S_a$–$S_d$ from the delay devices 61–64, and supplies the selected output to the monostable multivibrator 52 shown in FIG. 4. It is to be noted here that the delay designating signals $S_0$–$S_3$ should be set in preparation in the measurement control 46, prior to the exposure with the emitted pulses from the excimer laser 1.

Figure 7:
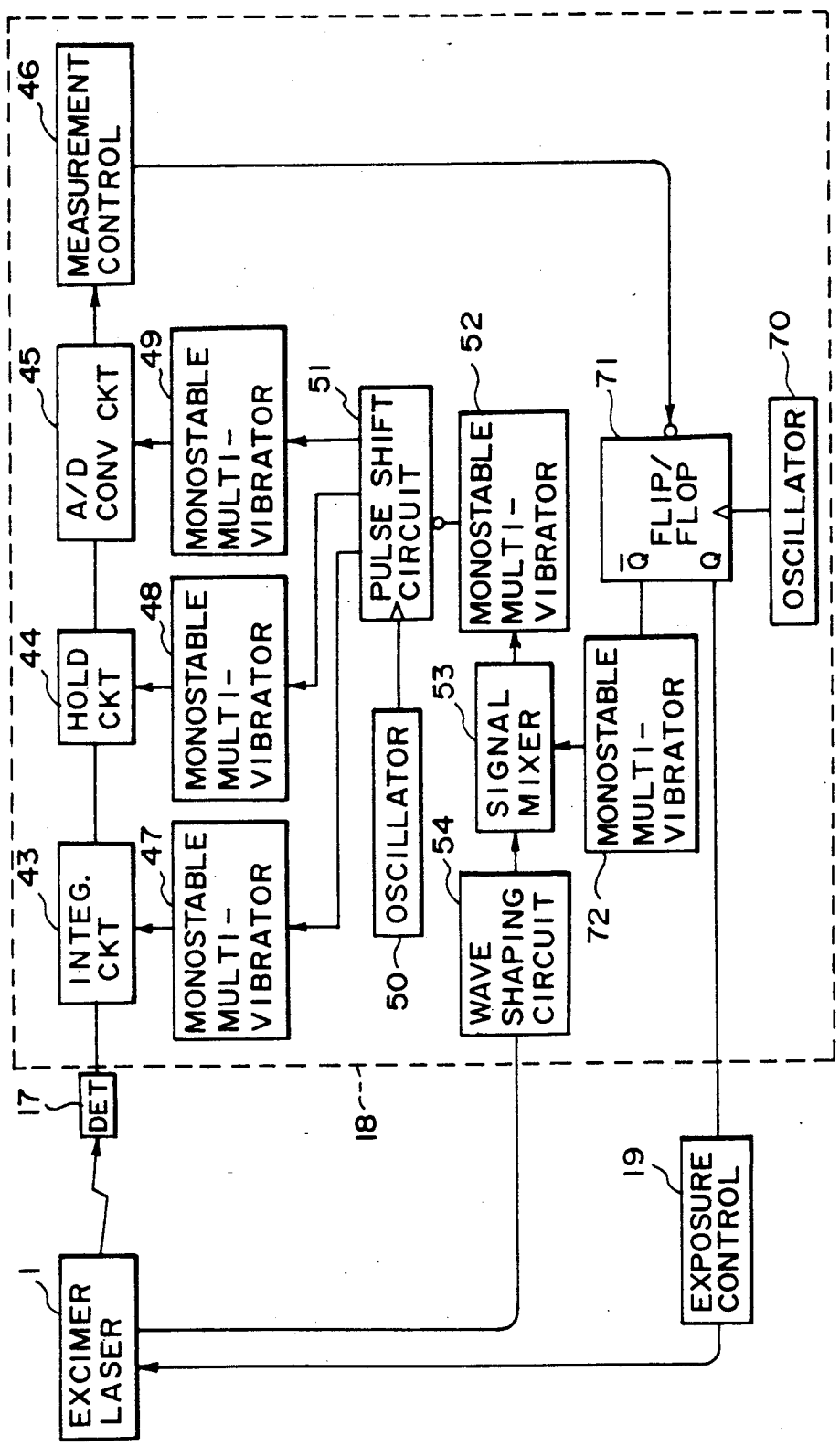
FIG. 7 is a block diagram showing another embodiment of the present invention.

FIG. 7 is a block diagram of a portion related to a signal processing unit 18 of an exposure apparatus according to another embodiment of the present invention. In this example, the light emission instruction to an excimer laser 1 which is a light source is supplied per one pulse. The structure from the excimer laser 1 to the wave shaping circuit 54 of the FIG. 7 embodiment is similar to the corresponding portion of the FIG. 4 embodiment and functions similarly. Therefore, only the difference of this embodiment from the FIG. 4 embodiment will be explained. In FIG. 7, denoted at 71 is a flip-flop which is adapted so that its outputs Q and $\overline{Q}$ are toggle operated at the period of the oscillation frequency of the oscillator 70 and with mutually different logics. Denoted at 72 is a monostable multivibrator which is operable at the rise of the output $\overline{Q}$ of the flip-flop 71.

Figure 8:
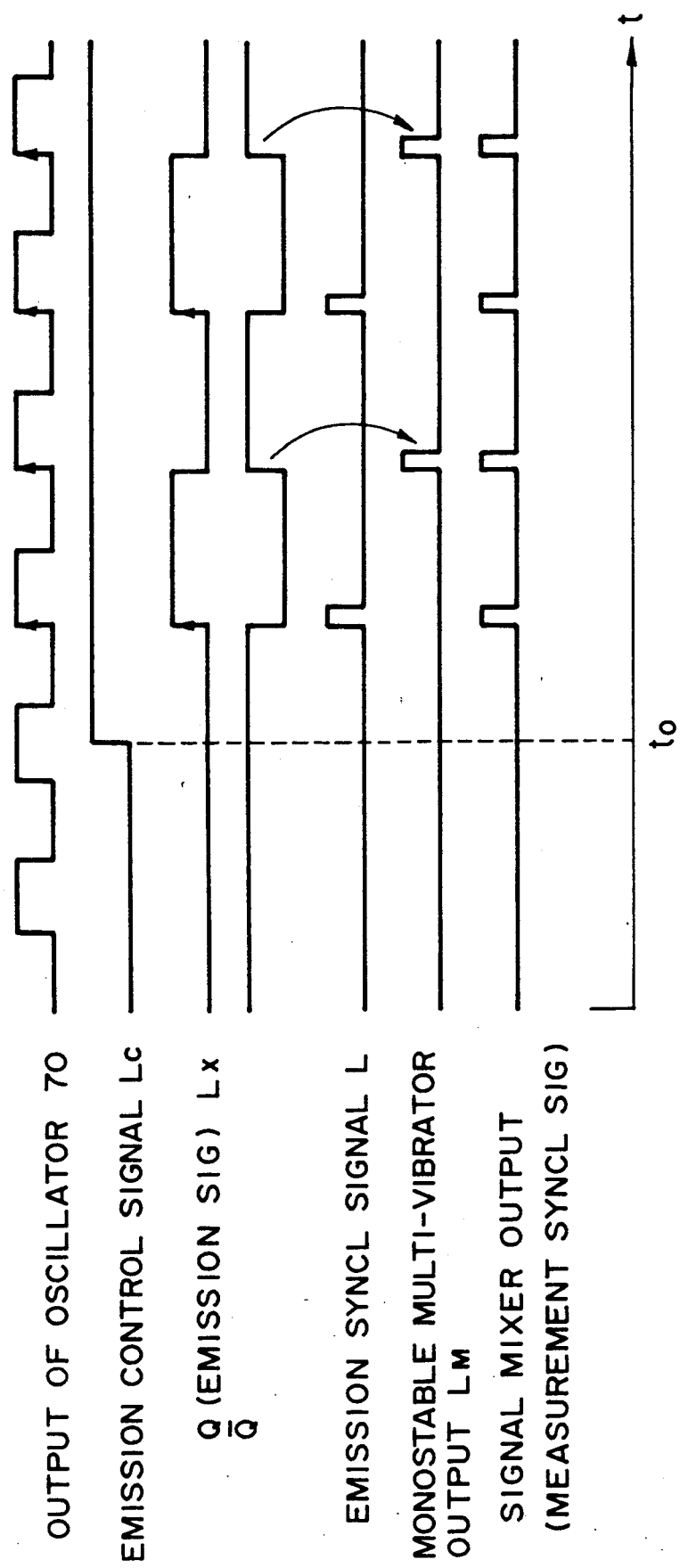
FIG. 8 is a timing chart, for explaining the operation of the FIG. 7 embodiment.

FIG. 8 is a timing chart showing the operation which is made when a light emission control signal $L_c$ is transmitted from the measurement control 46. As shown in this Figure, at time $t_0$ the emission control signal $L_c$ is outputted to the flip-flop 71 and, in response, the flip-flop 71 is rendered into an enable state and starts the toggle operation. The output Q of the flip-flop 71 is outputted to the excimer laser 1 by way of the exposure control 19, as a light emission excimer laser 1 starts the light emitting operation. On the other hand, the output $\bar{Q}$ of the flip-flop 71 triggers, at the timing of its rise, the monostable multivibrator 72. Here, the signal $L_M$ produced by the monostable multivibrator 72 and the emission synchronization signal L by the light emitting operation of the excimer laser 1, are in an alternating relationship. If the logical sum of them are taken by using the signal mixer 53, a pulse train of substantially regular intervals is obtained. Then, such a pulse train is used as the measurement synchronization signal M shown in FIG. 5, and advantageous effects similar to those in the FIG. 4 embodiment are obtainable.

While, in the embodiments shown in FIGS. 4 and 7, the offset integrating operation is executed each time one light pulse is emitted from the excimer laser 1, if the drift such as an offset voltage or otherwise occurs gradually with respect to time, depending on the precision of the integration exposure the offset integrating operation may be made at a time interval not beyond the tolerable range of the drift to obtain a correction value and, during the integration exposure, only the signal integrating operation may be made and, from a measured value obtained thereby, the correction value may be subtracted.

Figure 9:
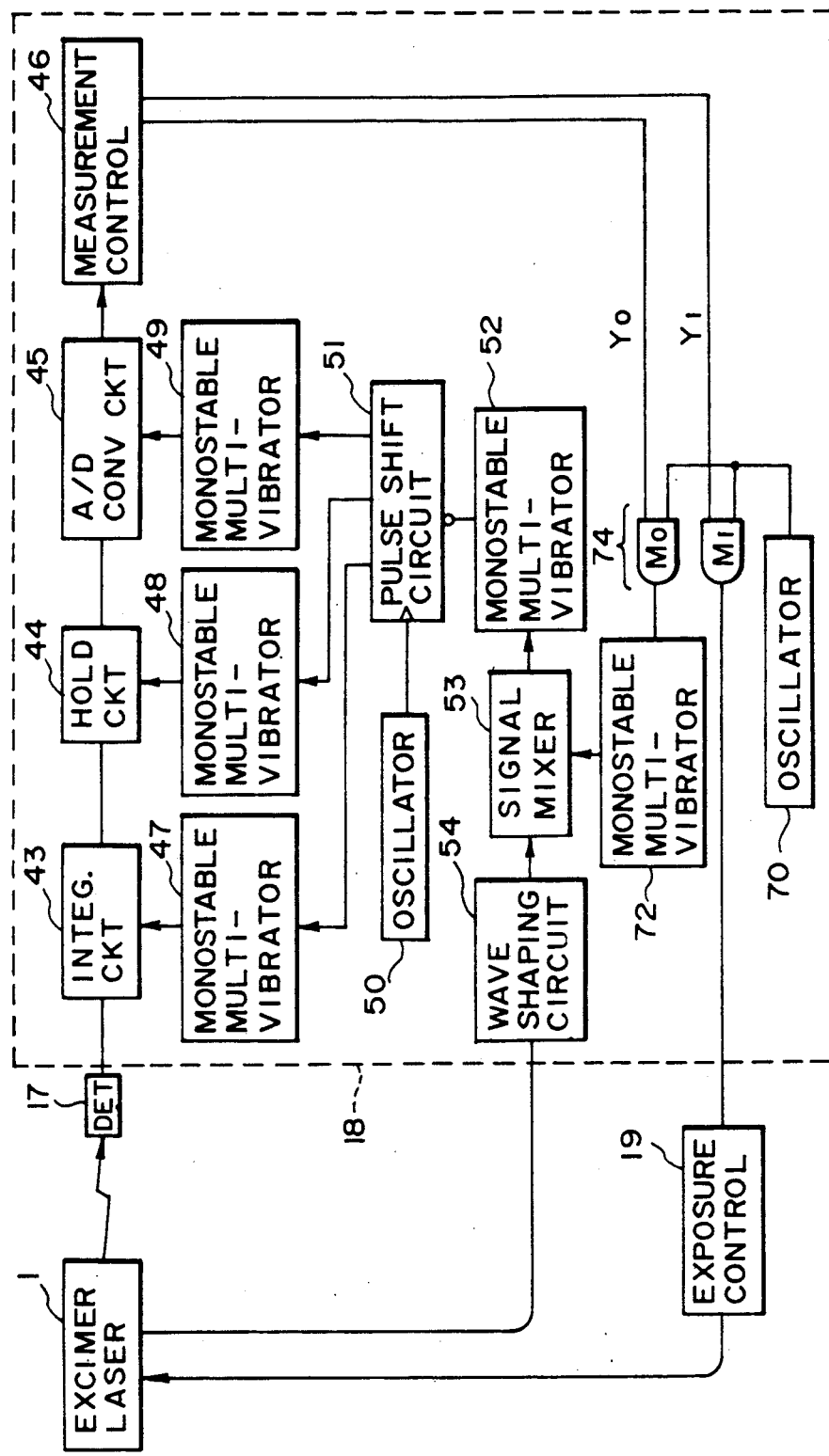
FIG. 9 is a block diagram showing a further embodiment of the present invention.

FIG. 9 shows such an example and illustrates a portion related to a signal processing unit 18 of an exposure apparatus according to a further embodiment of the present invention. In FIG. 9, the structure as denoted by reference numerals 1 through 54 is similar to the corresponding portion of the FIG. 4 embodiment and, except that an offset integration field is not present, the operations to be made in this portion are similar to those shown in the timing chart of FIG. 5. Referring to FIG. 9, in the offset integrating operation, the measurement control 46 produces only a selection signal $Y_0$ to operate the output $M_0$ of a multiplexer 74, and oscillated pulses of an oscillator 70 are inputted only to a monostable multivibrator 72. At this time, as described, the offset integrating operation is made and the measured value thereof is introduced into the measurement control 46 and is memorized as a correction value. Such offset integrating operation is executed as desired at the above-described time intervals. On the other hand, in the actual exposure operation, the measurement control 46 outputs only a selection signal $Y_1$ to operate the output $M_1$ of the multiplexer 74, and the oscillated pulses of the oscillator 70 are applied only to the excimer laser 1 by way of the exposure control 19 to execute the above-described signal integrating operation. By this, the measurement control 46 obtains a measured value of one emitted light pulse. Thus, by subtracting the memorized correction value from the measured value, only the signal component of each emitted light pulse can be extracted. Accordingly, the integration exposure can be executed by using an integrated exposure amount obtained by integrating the thus obtained signal components.

In accordance with the present invention, as described hereinbefore, the offset in the signal of the received light pulse from a light source can be removed, whereby any error due to the offset and drift of the offset in the measurement of the exposure amount can be avoided. Therefore, correct integration exposure is ensured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    a pulsed light source for repeatedly emitting a pulsed light;
    photoelectric converting means for receiving at least a portion of the pulsed light from said pulsed light source; and
    control means for controlling the emission of said pulsed light source, on the basis of a value related to a difference between a photoelectric signal produced from said photoelectric converting means at the time of emission of the pulsed light and an offset signal produced from said photoelectric converting means at the time of non-emission of the pulsed light.

2. An apparatus according to claim 1, wherein said pulsed light produces a light emission synchronization signal and wherein said control means includes signal forming means for forming a first gate signal related to the time of emission of the pulsed light and a second gate signal related to the time of non-emission of the pulsed light, in accordance with the light emission synchronization signal, integrating means for integrating the output of said photoelectric converting means in accordance with the first gate signal and for integrating the output of said photoelectric converting means in accordance with the second gate signal, and measuring means for detecting a difference between a signal component integrated by said integrating means in accordance with the first gate signal and an offset component integrated by said integrating means in accordance with the second gate signal.

3. An apparatus according to claim 2, wherein said measuring means detects the signal component and the offset component for each pulsed light and wherein said control means integrates for each pulsed light the difference between the signal component and the offset component and stops the emission of said pulsed light source when the integrated value becomes equal to a predetermined value.

4. An apparatus according to claim 2, wherein said signal forming means is adapted to set a desired interval with respect to the production of the first and second signals.

5. An apparatus according to claim 1, wherein said pulsed light source starts the emission of pulsed light in accordance with an emission instruction and wherein said control means includes signal forming means for forming a first gate signal related to the time of emission of the pulsed light in accordance with the emission instruction and a second gate signal related to the time of non-emission of the pulsed light, integrating means for integrating the output of said photoelectric converting means in accordance with the first gate signal and for integrating the output of said photoelectric converting means in accordance with the second gate signal, and measuring means for detecting a difference between a signal component integrated by said integrating means in accordance with the first gate signal and an offset component integrated by said integrating means in accordance with the second gate signal.

6. An apparatus according to claim 5, wherein said measuring means detects the signal component and the offset component for each pulsed light and wherein said control means integrates for each pulsed light the difference between the signal component and the offset component and stops the emission of said pulsed light source when the integrated value becomes equal to a predetermined value.

7. An apparatus according to claim 1, wherein said control means includes instruction means for outputting an offset detection instruction separate from a light emission instruction for causing said pulsed light source to emit the pulsed light, signal forming means for forming a gate signal related to the time of non-emission of the pulsed light in accordance with the offset detection instruction, integrating means for integrating, as an offset component, the output of said photoelectric converting means in accordance with the gate signal, and measuring means for detecting, for each pulsed light, a difference between the offset component and a signal component integrated in accordance with each pulsed light.

8. An apparatus according to claim 7, wherein said instruction means outputs the offset detection instruction before start by light emission of said pulsed light source.

9. An exposure apparatus for printing a pattern of an original onto a workpiece, said apparatus comprising:
   a light source for repeatedly providing pulsewise emission of light;
   an illumination optical system for illuminating the original with light emitted from said light source, to expose the workpiece to light passing through the original;
   a photoelectric converter for receiving at least a portion of the light emitted from said light source and passing through at least a portion of said illumination optical system, to produce an output based on photoelectric conversion of the received light, the output containing an offset from a measured value; and
   control means, comprising means for computing a difference between a first quantity corresponding to the offset of said converter and a second quantity corresponding to the offset-containing output produced by said converter, and comprising means for controlling the amount of exposure of the workpiece on the basis of the computed difference.

10. An apparatus according to claim 9, wherein said control means comprises means for memorizing an output of said converter produced during a non-emission period of said light source to determine the first quantity.

11. An apparatus according to claim 9, wherein said control means controls the amounts of exposure of the workpiece by controlling the pulsewise emission of said light source.

12. An apparatus according to claim 9, wherein said control means further comprises an integrator, for integrating outputs of said converter produced during repeated emission periods of said light source to determine the second quantity, and for integrating outputs of said converter produced during repeated non-emission periods of said converter to determine the first quantity.

13. An apparatus according to claim 12, wherein said integrator comprises an analog integrator, and wherein said control means further comprises an analog-to-digital converter for converting an integrated quantity produced by said integrator into a digital quantity.

14. An exposure control method for use with an exposure apparatus including a pulsewise emission type light source for emitting light and a photoelectric converter for receiving light emitted from the light source, said method comprising the steps of:
   illuminating an original having a pattern thereon with light emitted from the light source to expose a workpiece, onto which the pattern of the original is to be printed, to light passing through the original;
   receiving, through the photoelectric converter, at least a portion of the light emitted from the light source, such that the photoelectric converter produces an output based on photoelectric conversion of the received light;
   detecting offset from a measured value contained in the output produced by the photoelectric converter;
   computing a difference between a first quantity corresponding to the offset of the photoelectric converter and a second quantity corresponding to the offset-containing output produced by the photoelectric converter; and
   controlling the amount of exposure time of the workpiece on the basis of the computed difference.

15. A method according to claim 14, further comprising producing an output of the photoelectric converter during a non-emission period of the light source and memorizing the non-emission period output as the first quantity.

16. A method according to claim 14, wherein said step of controlling the amount of exposure of the workpiece comprises controlling the pulsewise emission of the light source.

17. A method of exposing a mask and a wafer in the manufacture of semiconductor devices to light emitted from a pulsewise emission type light source, said method comprising the steps of:
   detecting light emitted from the light source using a photodetector and producing a photodetector output;
   detecting offset from a measured value contained in the photodetector output;
   detecting a difference between a first quantity corresponding to the offset of the photodetector and a second quantity corresponding to the offset-containing output of the photodetector; and
   exposing the mask and the wafer to the light emitted from the light source, while controlling the exposure on the basis of the detected difference.

* * * * *

UNITED STATES PATENT AND TRADEMARK OFFICE
CERTIFICATE OF CORRECTION

PATENT NO. : 5,053,614
DATED : October 1, 1991
INVENTOR(S) : Yoshikiyo Yui, et al.

It is certified that error appears in the above-identified patent and that said Letters Patent is hereby corrected as shown below:

IN THE DRAWINGS

FIGURE 3

"SYNCL" should read --SYNCH--.

FIGURE 5

"SYNCL" should read --SYNCH (both occurrences).

FIGURE 8

"SYNCL" should read --SYNCH-- (both occurrences).

IN THE DISCLOSURE

COLUMN 1

Line 38, "lapse" should read --elapse--; and
Line 57, "%-2%" should read --1-2%--.

COLUMN 2

Line 21, "affected." should read --effected.--.

UNITED STATES PATENT AND TRADEMARK OFFICE
CERTIFICATE OF CORRECTION

PATENT NO. : 5,053,614
DATED : October 1, 1991
INVENTOR(S) : Yoshikiyo Yui, et al.

It is certified that error appears in the above-identified patent and that said Letters Patent is hereby corrected as shown below:

COLUMN 3

Line 19, The right margin should be closed up;
Line 20, The left margin should be closed up;
Line 22, "Y stage." should read --Y-stage.--; and
Line 51, "af-" should read --ef- --.

COLUMN 5

Line 9, "affected" should read --effected--; and
Line 22, "two," should read --two--.

COLUMN 6

Line 53, "$\bar{Q}$are" should read --$\bar{Q}$ are--;
Line 57, "$\bar{Q}$of" should read --$\bar{Q}$ of--; and
Line 67, "emission excimer" should read --emission instruction signal $L_x$. At the rise of this signal, the excimer--.

UNITED STATES PATENT AND TRADEMARK OFFICE
CERTIFICATE OF CORRECTION

PATENT NO. : 5,053,614

DATED : October 1, 1991

INVENTOR(S) : Yoshikiyo Yui, et al.

It is certified that error appears in the above-identified patent and that said Letters Patent is hereby corrected as shown below:

COLUMN 7

Line 1, "$\bar{Q}$of" should read --$\bar{Q}$ of--; and
Line 17, "exposure" should read --exposure,--.

COLUMN 9

Line 20, "by" should read --of-- and "of" should read --by--.

Signed and Sealed this

Sixteenth Day of March, 1993

Attest:

STEPHEN G. KUNIN

Attesting Officer

Acting Commissioner of Patents and Trademarks